United States Patent [19]
Lee

[11] Patent Number: 5,646,906
[45] Date of Patent: Jul. 8, 1997

[54] METHOD & APPARATUS FOR REAL-TIME PROCESSING OF MOVING PICTURE SIGNALS USING FLASH MEMORIES

[75] Inventor: Seung-ho Lee, Suwon, Japan

[73] Assignee: Samsung Electronics Co., Ltd., Kyungki-Do, Rep. of Korea

[21] Appl. No.: 612,415

[22] Filed: Mar. 7, 1996

[30] Foreign Application Priority Data

Mar. 8, 1995 [KR] Rep. of Korea .................. 95-4705

[51] Int. Cl.$^6$ .................. G11C 7/00; G11C 8/00
[52] U.S. Cl. .................. 365/240; 365/239; 365/221; 365/233; 365/230.09; 365/219; 365/189.12
[58] Field of Search .................. 365/189.01, 230.01, 365/221, 233, 230.09, 239, 240, 219, 189.12

[56] References Cited

U.S. PATENT DOCUMENTS

| | | |
|---|---|---|
| 4,949,333 | 8/1990 | Gulick et al. .................. 370/32 |
| 4,969,126 | 11/1990 | Maeno .................. 365/239 |
| 5,272,675 | 12/1993 | Kobayashi .................. 365/240 |
| 5,291,457 | 3/1994 | Asato et al. .................. 365/239 |
| 5,432,741 | 7/1995 | Devore et al. .................. 365/240 |
| 5,521,876 | 5/1996 | Hattori et al. .................. 365/221 |
| 5,526,316 | 6/1996 | Lin .................. 365/221 |
| 5,570,040 | 10/1996 | Lytle et al. .................. 362/41 |

*Primary Examiner*—Viet Q. Nguyen
*Attorney, Agent, or Firm*—Sughrue, Mion, Zinn, Macpeak & Seas

[57] ABSTRACT

A method and apparatus for processing moving picture signals on a real time basis using flash memories, in which the moving picture signals can be recorded and reproduced on the real time basis according to time division technology using multi-stage flash memories. The moving picture signal real-time processing apparatus using the flash memories provide a data output with which the moving picture signal can be processed on a real time basis, by a time division technology which uses an overlappingly multi-stage register portion, a multi-stage FIFO memory portion and a multi-stage flash memory portion.

10 Claims, 8 Drawing Sheets

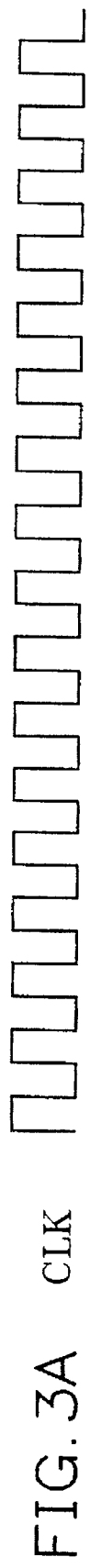 FIG. 3A CLK
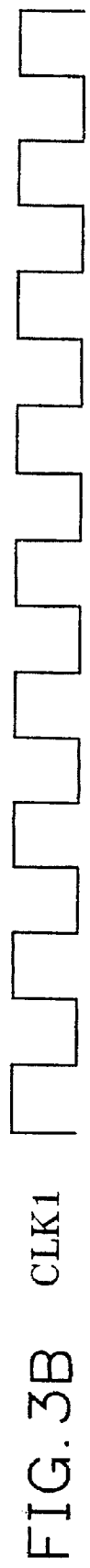 FIG. 3B CLK1
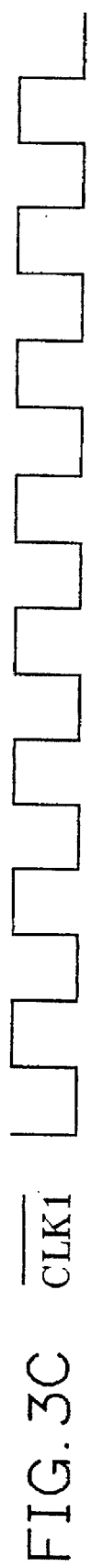 FIG. 3C $\overline{\text{CLK1}}$
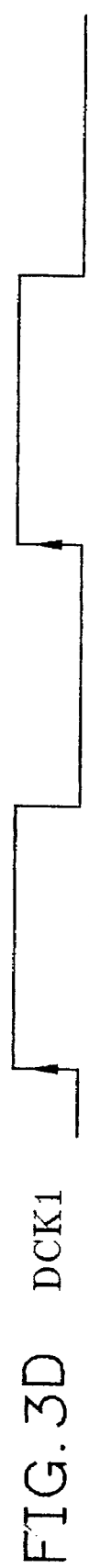 FIG. 3D DCK1
 FIG. 3E DCK2
 FIG. 3F DCK3
 FIG. 3G DCK4

METHOD & APPARATUS FOR REAL-TIME PROCESSING OF MOVING PICTURE SIGNALS USING FLASH MEMORIES

BACKGROUND OF THE INVENTION

The present invention relates to a method and apparatus for processing moving picture signals using flash memories. More particularly, the invention relates to a method an apparatus for processing moving picture signals on a real time basis using a time division technology and a multi-stage flash memory.

The flash memory is a non-volatile semiconductor memory in which stored data is preserved even if power applied to the memory is disconnected. Data is recorded on and reproduced from the flash memory in units of one byte or one page (which corresponds to 256 bytes or 264 bytes), using various control ports and input/output (I/O) ports of the flash memory.

When flash memories are used for a moving picture recording and reproducing apparatus in the prior art, one flash memory is selected from among a number of the flash memories to perform data input and output in units of one page (264 bytes). The rest of the flash memories are sequentially accessed to record or produce a moving picture signal in units of one page.

However such a conventional method cannot process moving picture signals on a real time basis because the flash memory access time is long for the data recording and reproducing operation.

For example, flash memory model No. KM29N1600 made by the Semiconductor Division of Samsung Electronics Co., Ltd, requires approximately 155.9 ns to reproduce one byte and about 1.14 µs to record one byte when data is recorded and reproduced in units of one page. By contrast, it takes about 69.84 ns byte to process the composite video signal for moving picture signal on a real time basis. Thus, it is impossible to process a moving picture signal on a real time basis using a the above flash memory.

SUMMARY OF THE INVENTION

To solve the above problem, it is an object of the present invention to provide a method and apparatus for processing a moving picture signal on a real time basis using flash memories.

To accomplish the above object of the present invention there is provided a method for processing a moving picture signal on a real time basis using flash memories, the method comprising the steps of:

(a) applying the moving picture signal to a first register portion in synchronization with a data input clock signal having a frequency which is appropriate for processing the moving picture signal on a real time basis;

(b) dividing the data input clock signal to generate a divided clock;

(c) applying the moving picture signal output from the first register portion to each register of a multi-stage register portion in synchronization with the divided clock signal;

(d) storing the output of a register in the multi-stage register position in a corresponding FIFO memory of a multi-stage FIFO memory portion;

(e) applying the output of each FIFO memory in the multi-stage FIFO memory portion to a corresponding flash memory in a multi-stage flash memory portion; and (f) reading and combining the moving picture signal stored in each flash memory in the multi-stage flash memory portion.

To achieve the above object of the present invention, there is provided an apparatus for processing a moving picture signal on a real time basis using flash memories, the apparatus comprising:

first register means for performing a data input and output of the moving picture signal in synchronization with a data input clock signal having a frequency which is appropriate for processing the moving picture signal on a real time basis;

clock signal divider means for dividing the data input clock to generate divided clock signal;

multi-stage register means having overlapping registers for storing the moving picture signal output from the first register means in synchronization with the divided clock signal;

multi-stage FIFO memory means having overlapping FIFO memories for storing the output of each register in the multi-stage register position; and multi-stage flash memory means having overlapping flash memories for applying the output of each FIFO memory in the multi-stage FIFO memory portion.

BRIEF DESCRIPTION OF THE DRAWINGS

The above objects and other advantages of the present invention will become more apparent by a detailed description of a preferred embodiment with reference to the attached drawings in which:

FIGS. 3A through 3G are waveform diagrams of the input and output clock pulses in the FIG. 2 clock divider.

DETAILED DESCRIPTION OF THE PREFERRED EMBODIMENT

A preferred embodiment of the present invention will be described below in more detail with reference to the accompanying drawings.

Figure 1:
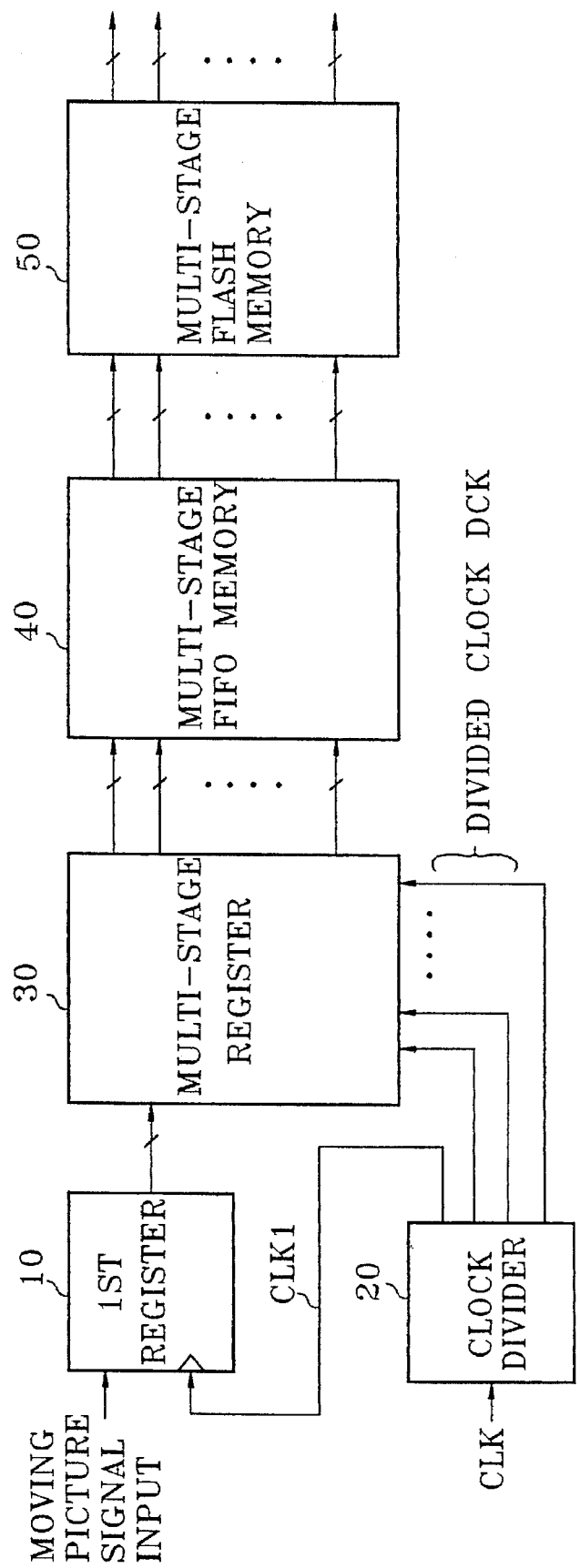
FIG. 1 is a block diagram of a real-time moving picture signal processing apparatus using flash memories according to the present invention.

FIG. 1 illustrates a block diagram of a real-time moving picture signal processing apparatus using flash memories according to one embodiment of the present invention. A clock divider 20 receives clock signal CLK and outputs data input clock signal CLK1 for inputting a moving picture signal and a divided clock signal DCK resulting from division of the data input clock CLK1. A first register portion 10 outputs the input moving picture signal in synchronization with the data input clock signal CLK1. A multi-stage register portion 30 receives the output of the first register portion and outputs the received signal to each D flip-flop (not shown) of the multi-stage register portion 30 in synchronization with the divided clock signal DCK. More specifically, the data input to the multi-stage register portion 30 is sequentially stored in each D flip-flop within the multi-stage register portion 30 according to the divided clock signal DCK. The output of each D flip-flop in the multi-stage register portion 30 is stored in each a corresponding FIFO memory of the multi-stage FIFO memory portion 40 prior to being input to a multi-stage flash memory portion 50. Particularly, data of the one-page unit (264 bytes) which is a recording and reproducing unit of the flash memory, is stored in each FIFO memory. The output of each FIFO memory in the multi-stage FIFO memory portion 40 is individually input to each flash memory of the multi-stage flash memory portion 50. Thus, when data is read out from the multi-stage flash memory portion 50, the data of each flash memory in the multi-stage flash memory portion 50 is sequentially read out and combined according to a divided clock signal, to obtain reproduction of moving picture signals on a real time basis.

As described above, the present invention apparatus can process an enormous amount of data for the moving picture signal within a short time by using time division technology with a multi-stage flash memory portion in comparison with a conventional flash memory apparatus using single flash memories in sequence.

The detailed construction and operation of the FIG. 1 apparatus of in the case where the multi-stage flash memory portion 50 comprises four flash memories will be described below with reference to FIGS. 2 through 8.

Figure 2:
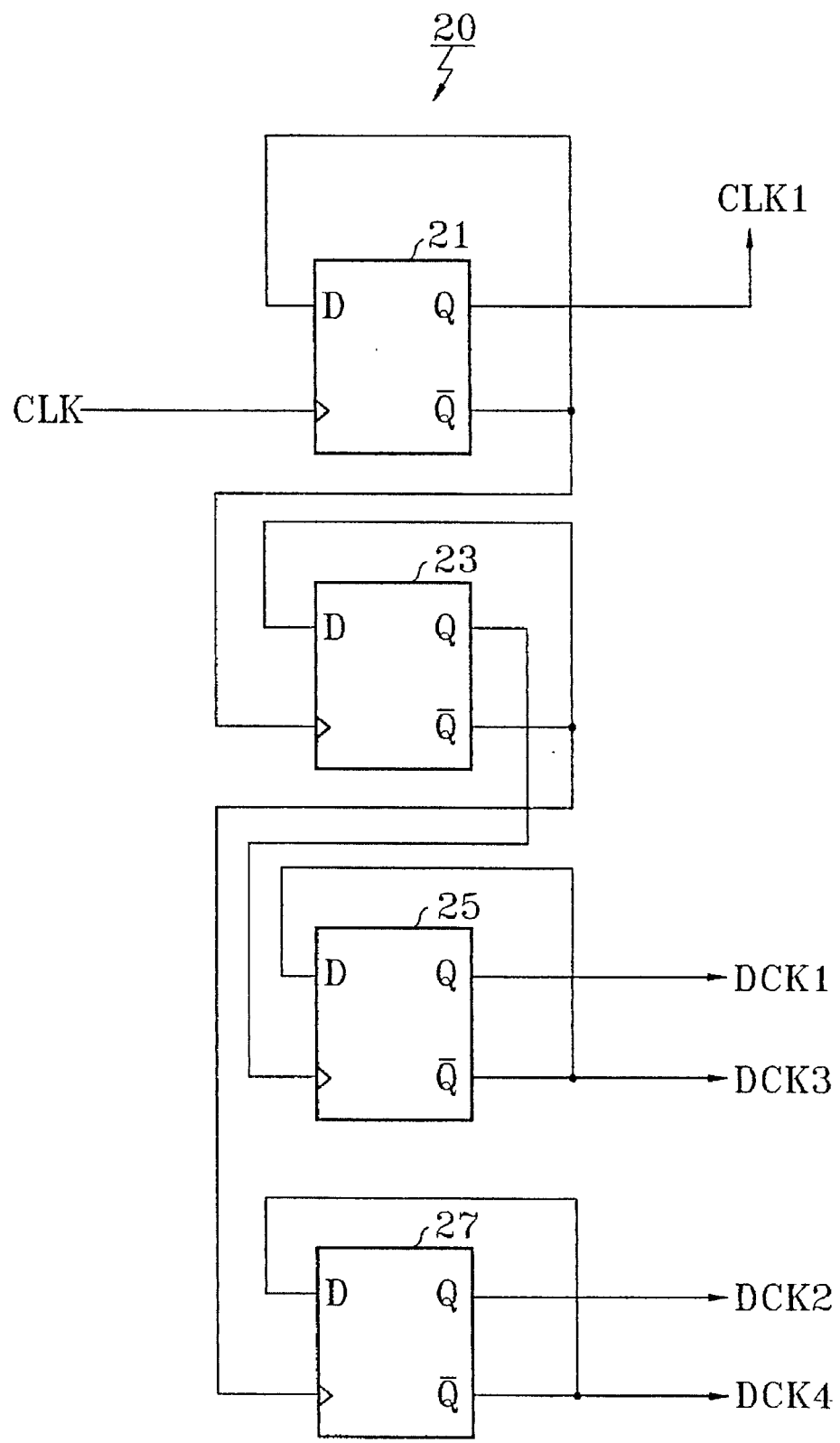
FIG. 2 is a detailed circuit diagram of a clock divider in a four-stage flash memory portion according to one embodiment of the present invention.

FIG. 2 is a detailed circuit diagram of a clock divider 20 when a multi-stage flash memory portion 50 has a four-stage flash memory. FIGS. 3A through 3G are waveform diagrams of the input and output clock pulses after a divided-by-four operation in the clock divider 20 of FIG. 2.

If clock signal CLK input to the clock divider 20 is 27 MHz to perform real-time processing of the moving picture signal, a D flip-flop 21 of FIG. 2 divides the input clock signal CLK by two, and outputs a data input clock signal CLK1 of 13.5 MHz and the inverted data input clock signal $\overline{CLK1}$ which are respectively shown in FIGS. 3B and 3C. The data input clock CLK1 is supplied to a first register portion 10, and the inverted data input clock $\overline{CLK1}$ is supplied to a D flip-flop 23, The inverted data input clock $\overline{CLK1}$ is converted into divided clock pulses DCK1 and DCK3 which are shown in FIGS. 3D and 3E, by D flip-flops 23 and 25. The inverted data input clock $\overline{CLK1}$ is also converted into divided clock pulses DCK2 and DCK4, which are shown in FIGS. 3F and 3G, by D flip-flops 23 and 27. Here, frequencies of the clock pulses DCK1 through DCK4 are 3.375 MHz. The divided clock pulses DCK1 through DCK4 output from the D flip-flops 25 and 27 are applied to the multi-stage register portion 30.

The data of the input moving picture signal output from the first register portion 10 according to the data input clock CLK1 output from the clock divider 20, is synchronized with each of the divided clock pulses DCK1 through DCK4 obtained by the divided-by-four operation of the data input clock CLK1 and sequentially stored in each D flip-flop within the multi-stage register portion 30.

Figure 4:
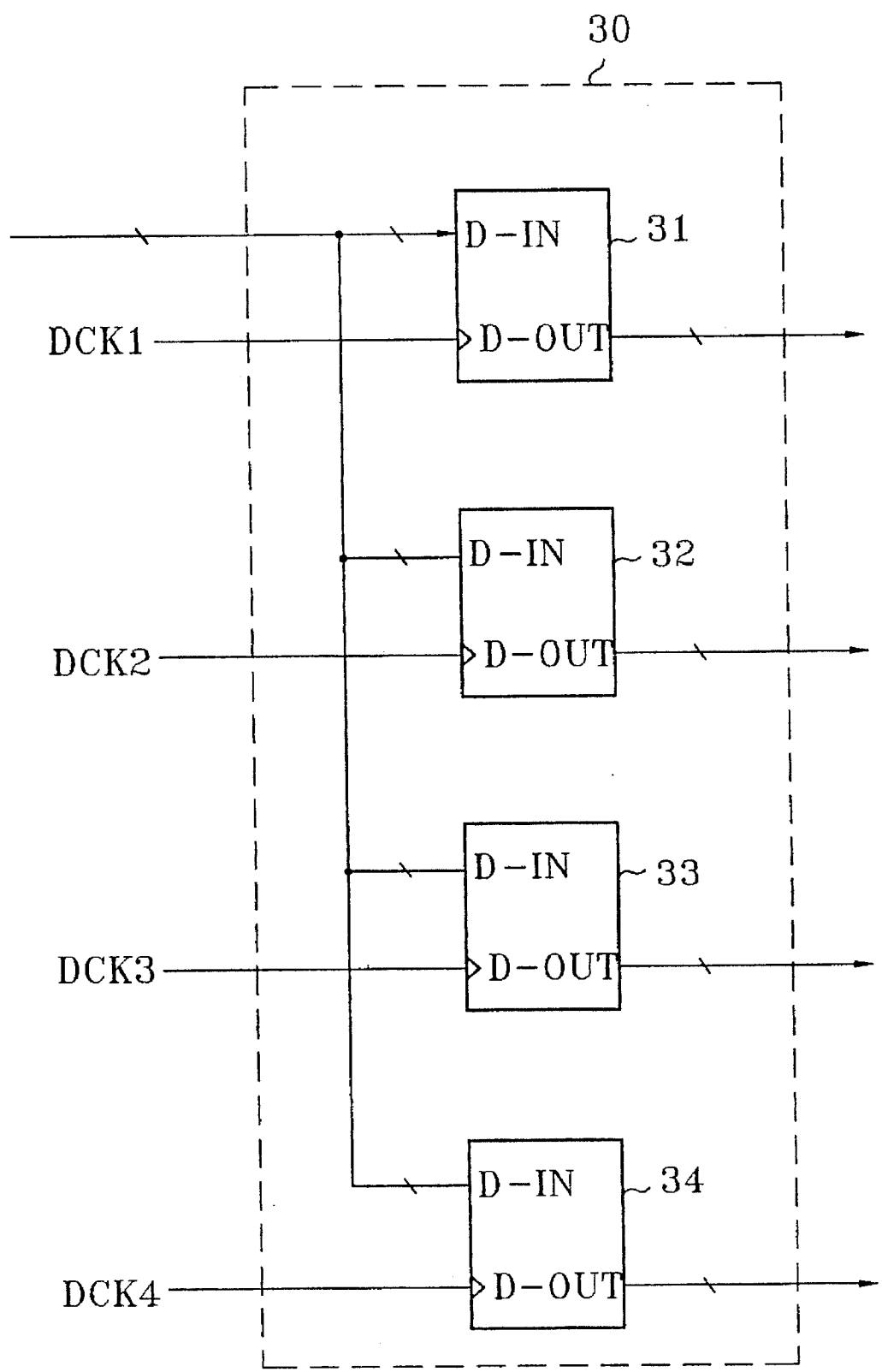
FIG. 4 is a detailed circuit diagram of a multi-stage register portion in the four-stage flash memory portion according to one embodiment of the present in vention.
Figure 5:
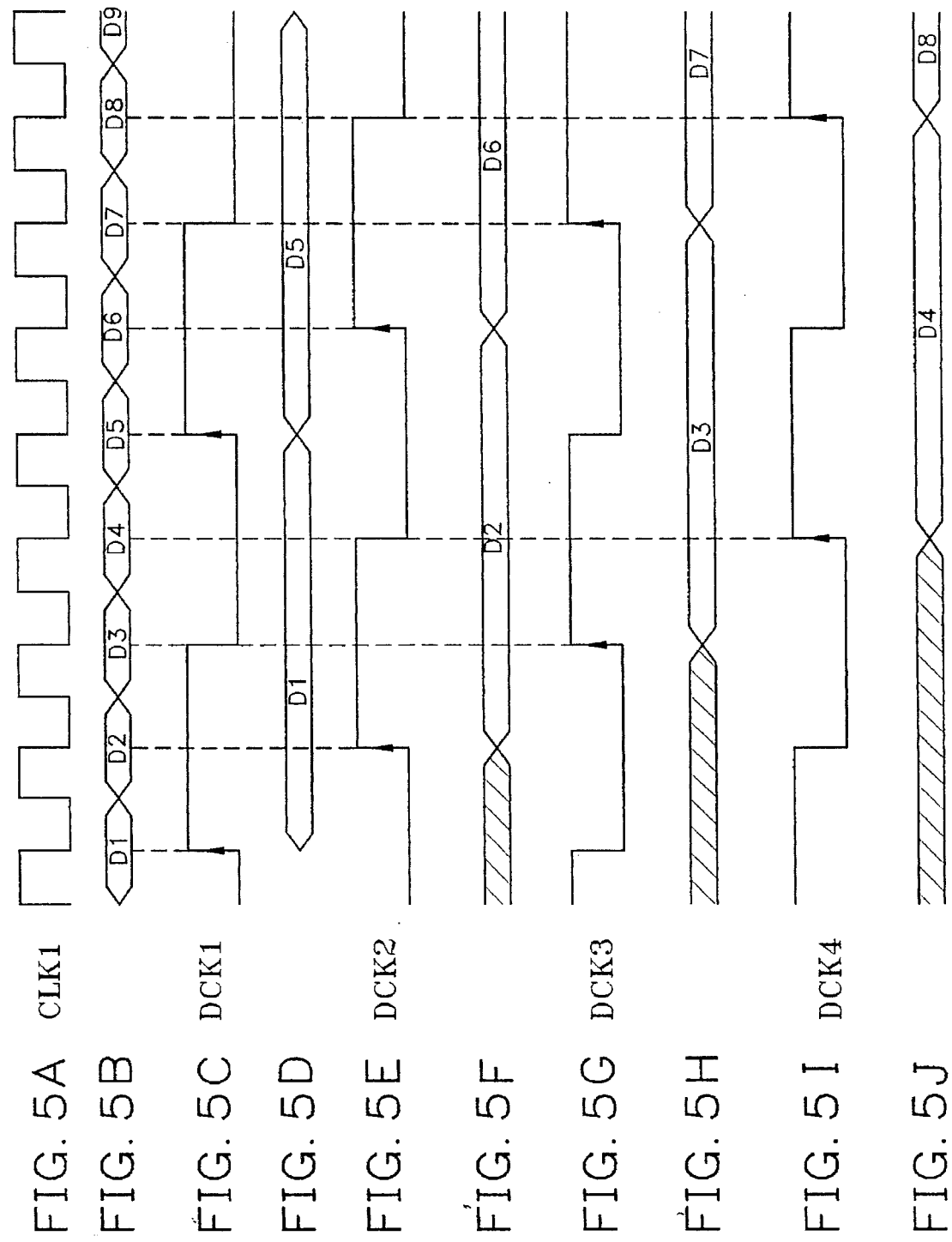
FIGS. 5A through 5J are waveform diagrams of the data output from the multi-stage register portion of FIG. 4.

FIG. 4 is a detailed circuit diagram of a multi-stage register portion 30. FIGS. 5A through 5J are waveform diagrams of the data written in and output from each D flip-flop in the multi-stage register portion 30 of FIG. 4.

The multi-stage register portion 30 stores the data shown in FIG. 5B supplied from the first register portion 10, in synchronization with the divided clock pulses DCK1 through DCK4 applied from the clock divider 20. More specifically, when N is 0, 1, 2, 3, ..., a D flip-flop 31 in the multi-stage resister portion 30 stores $(4N+1)^{th}$ data, that is, D1, D5, .... Similarly, a D flip-flop 32 stores $(4N+2)^{th}$ data, that is, D2, D6, ... a D flip-flop 33 stores D3, D7 ... a D flip-flop 34 stores D4, D8, .... The data stored in each D flip-flops 31 through 34 is shown in FIGS. 5D, 5G, 5H and 5J. respectively.

Figure 6:
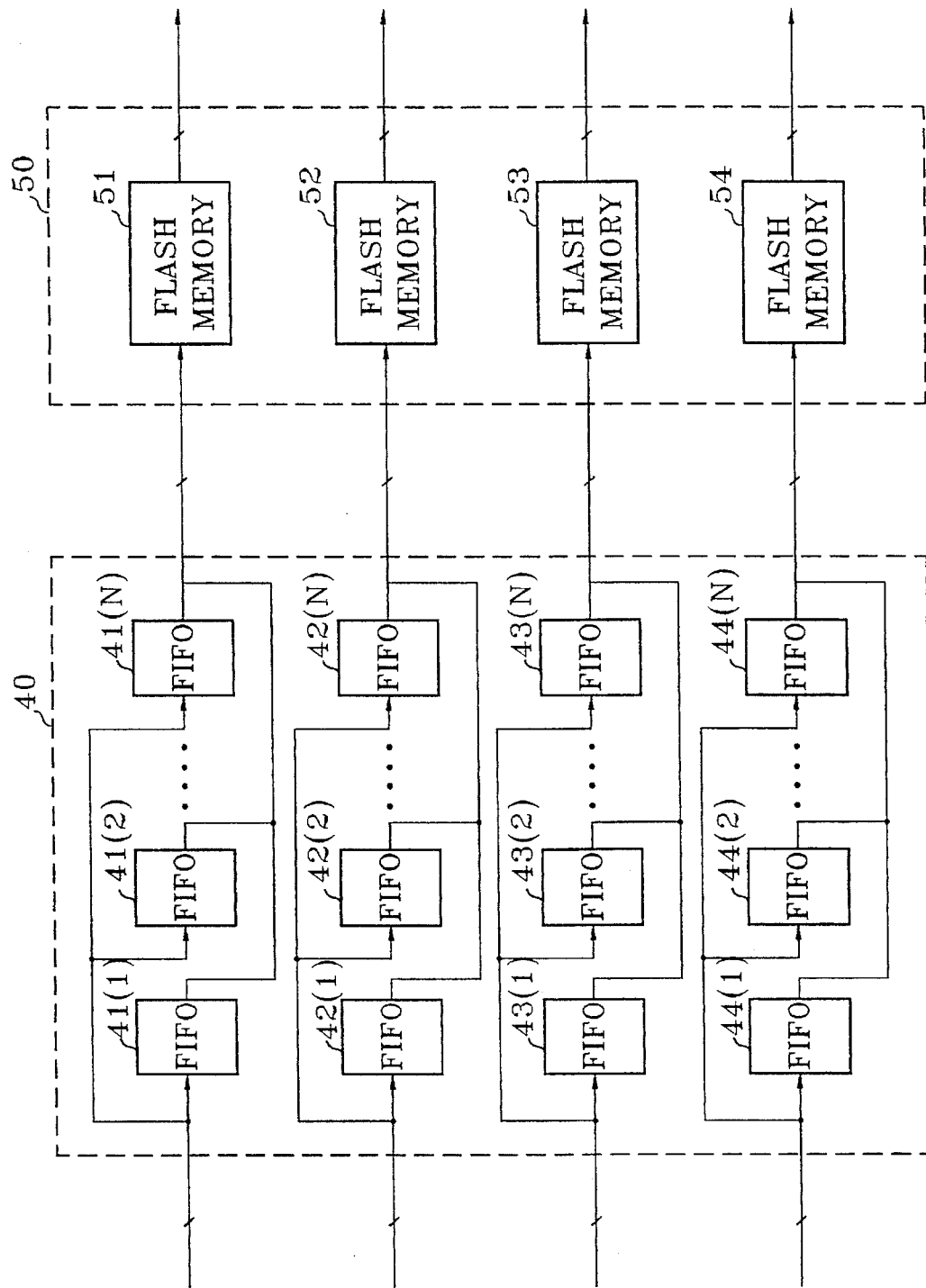
FIG. 6 is a detailed circuit diagram of the multi-stage FIFO memory portion and the multi-stage flash memory portion in the four-stage flash memory portion according to one embodiment of the present invention.

FIG. 6 is a detailed circuit diagram of the multi-stage FIFO memory portion 40 and the multi-stage flash memory portion 50.

The data output from the D flip-flops 31 through 34 in the multi-stage register portion 30 is stored in a corresponding stage of FIFO memory 41(1, ..., N), 42(1, ..., N), 43(1, ..., N) and 44(1, ..., N) in the multi-stage FIFO memory portion 40. Each stage FIFO memory portion 41(1, ..., N), 42(1, ..., N), 43(1, ..., N) or 44(1, ..., N) stores the data of one page (264 bytes). The individual FIFO memories of each stage, that is, the individual FIFO memories 41(1), ..., or 41(N) of the first stage sequentially the data of one page. More specifically with respect to the data output from the D flip-flop 31 in the multi-stage register portion 30, the individual FIFO memory 41(1) stores the firstly input one page data, and the individual FIFO memory 41(2) stores the secondly input one page data. The other individual FIFO memories 41(3), ..., 41(N) store the input for the remainder of the page in the same manner as in the case of the first and second individual FIFO memories 41(1) and 41(2).

Figure 7:
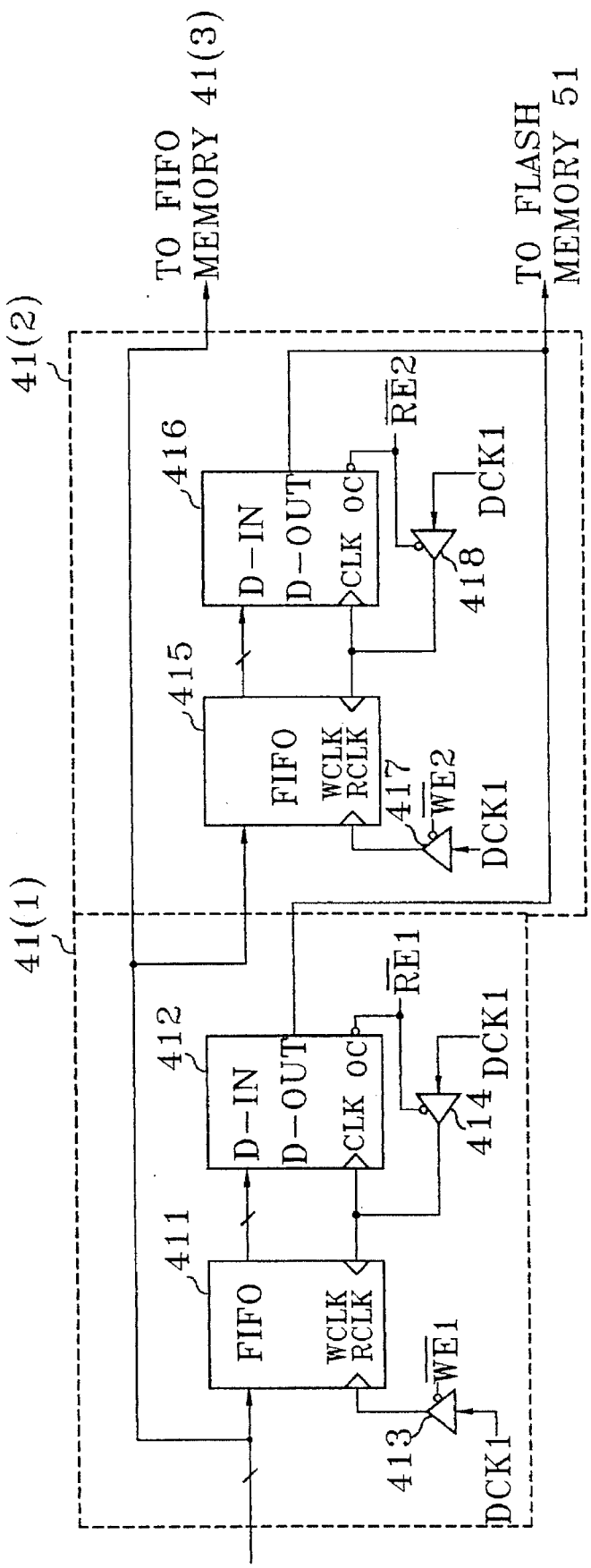
FIG. 7 is a detailed circuit diagram of the first-stage FIFO memories of the multi-stage FIFO memory portion of FIG. 6.

FIG. 7 is a detailed circuit diagram of the first-stage FIFO memories 41(1) and 41(2) of FIG. 6.

A FIFO memory 411 stores data of one-page unit of the data output from the D flip-flop 31 in the multi-stage register portion 30, and a FIFO memory 415 stores the next unit of the data output from the D flip-flop 31. For such an operation, a buffer 413 or 417 should be sequentially enabled in units of 264 bytes.

Although it is not described in connection with FIG. 7, the other FIFO memories 41(3) ... 41(N) perform the same functions as those of the FIFO memories 41(1) and 41(2).

Figure 8:
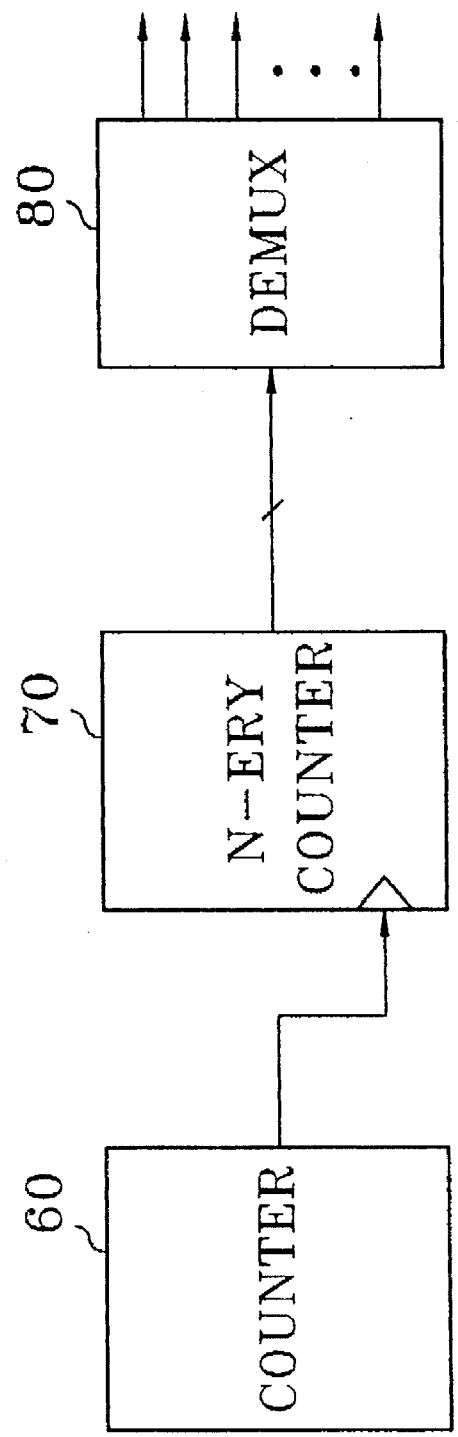
FIG. 8 is a block diagram of an apparatus for sequentially selecting a write enable signal WE or a read enable signal RE of each FIFO memory in units of 264 bytes.

FIG. 8 is a block diagram of an apparatus for sequentially selecting a write enable signal WE and a read enable signal RE of each FIFO memory in units of 264 bytes.

In FIG. 8, "N" in an N-ary counter should correspond to the number of the FIFO memories of each stage in the multi-stage FIFO memory portion.

A counter 60 generates a clock input to a N-ary counter 70 for every 264-bytes, using divided clock pulses DCK1 having frequencies of 3.375 MHz or data input clock signal CLK1 having frequencies of 13.5 MHz from the clock divider 20. Here, an output clock of counter 60 is input to the N-ary counter 70 for every data of 264-byte output from each stage within the multi-stage register portion 30. The output of the N-ary counter is input to a demultiplexer 80 which selects and outputs one of N outputs of the demultiplexer 80.

The output of the demultiplexer 80 activates the write enable signal WE and the read enable signal RE of each FIFO memory.

That is, since the write enable signal WE and the read enable signal RE of each FIFO memory are sequentially selected in units of 264 bytes according to the above-described operation, the data of the 264-byte unit is sequentially written and read with respect to each FIFO memory.

Meanwhile, the number N of the FIFO memories of each stage is determined by a write time of writing the moving picture signal in the flash memory portion 50. Since the data is continuously input to the multi-stage FIFO memory portion 40 at a 3.775 MHz rate during writing of the moving picture signal in the multi-stage flash memory portion 50, the amount of data stored in the FIFO memory becomes larger as the time of writing the moving picture signal in the flash memory portion 50 Therefore, the number N of the FIFO memories of each stage in the multi-stage FIFO memory portion 40 should be increased accordingly.

The data output from the multi-stage FIFO memory portion 40 is input to the flash memories 51 through 54 of each stage in the multi-stage flash memory portion 50 corresponding to the FIFO memory of each stage.

When the data is read from the multi-stage flash memory portion 50, the data is sequentially reproduced from the respective flash memories 51 through 54 at a 3.775 MHz clock rate which corresponds to the divide-by-four clock signals DCK1, DCK2, DCK3 or DCK4, and the reproduced data is combined to obtain a data output satisfying a real-time processing of 13.5 MHz.

In the present invention, the number of the stages of the overlapping flash memories in the multi-stage flash memory portion 50 is determined by the time for processing the moving picture signal. As the time for processing the moving picture signal decreases, the number of the stages should be increased. Depending on the number of the stages of the overlapping flash memories, the number of the stages of the overlapping FIFO memories in the multi-stage FIFO memory portion 40 and the number of the stages of the overlapping D flip-flops in the multi-stage register portion 30 should also be increased. The number of the divided clock pulses output from the clock divider 20 should be increased according to the number of the stages.

As described above, the moving picture signal real-time processing apparatus using the flash memories according to the present invention, provide obtain a data output with which the moving picture signal can be processed on a real time basis, by a time division technology which uses an overlapping multi-stage register portion, a multi-stage FIFO memory portion and a multi-stage flash memory portion.

While the present invention has been particularly shown and described with reference to a particular embodiment thereof, it will be understood by those skilled in the art that various changes in form and details may be effected therein without departing from the spirit and scope of the invention as defined by the appended claims.

What is claimed is:

1. A method for processing a moving picture signal on a real-time basis using flash memories, comprising the steps of:

(a) applying the moving picture signal to a first register portion in synchronization with a data input clock to produce a synchronized signal, said data input clock having a frequency appropriate for processing the moving picture signal on a real-time basis;

(b) dividing the data input clock to generate a divided clock;

(c) applying the synchronized signal output from said first register portion to one of a plurality of registers of a multi-stage register portion in synchronization with the divided clock;

(d) storing the output of each register in said multi-stage register portion in one of a plurality of stages of FIFO memories of a multi-stage FIFO memory portion;

(e) applying the output of each stage of FIFO memories in said multi-stage FIFO memory portion to one of a plurality of flash memories in a multi-stage flash memory portion; and (f) reading and combining the output of each flash memory in said multi-stage flash memory portion as a processed moving picture signal.

2. The real-time moving picture signal processing method according to claim 1, wherein the data stored in each stage of FIFO memory of said multi-stage FIFO memory portion in said step (d) corresponds to at least one of: a writing and reading capacity of one of said flash memories.

3. An apparatus for processing a moving picture signal on a real-time basis using flash memories, said apparatus comprising:

first register means for performing data input and output of the moving picture signal in synchronization with a data input clock to produce a synchronized signal, said clock having a frequency appropriate for processing the moving picture signal on a real-time basis;

clock divider means for dividing the data input clock to generate a divided clock;

multi-stage register means having overlapping registers, each register storing the synchronized signal output from said first register means in synchronization with the divided clock;

multi-stage FIFO memory means having overlapping FIFO memories, arranged in a plurality of stages, wherein each stage stores the output of a register in said multi-stage register means; and multi-stage flash memory means having overlapping flash memories, each flash memory applying the output of a stage of FIFO memories of said multi-stage FIFO memory means.

4. The real-time moving picture signal processing apparatus using flash memories according to claim 3, wherein each stage of said multi-stage FIFO memory means comprises a plurality of FIFO memories connected in series.

5. The real-time moving picture signal processing apparatus using flash memories according to claim 4, wherein each stage of said multi-stage FIFO memory means comprises a device for storing data corresponding to at least one of: a writing and reading capacity of one flash memory.

6. The real-time moving picture signal processing apparatus using flash memories according to claim 3, 4, or 5, wherein said first register means comprises a D flip-flop.

7. The real-time moving picture signal processing apparatus using flash memories according to claim 3, 4, or 5, wherein each register of each stage in said multi-stage register means comprises a D flip-flop.

8. An apparatus for processing a moving picture signal on a real-time basis using flash memories, said apparatus comprising:

first register means for performing data input and output of the moving picture signal in synchronization with a data input clock to produce a synchronized signal, said clock having a frequency appropriate for processing the moving picture signal on a real-time basis;

clock divider means for dividing the data input clock to generate a divided clock;

register means having a plurality of registers, each register storing the synchronized signal output from said first register means in synchronization with the divided clock;

FIFO memory means having a plurality of FIFO memories, arranged in a plurality of stages, wherein each stage stores the output of a register in said register means; and multi-stage flash memory means having a plurality of flash memories, each flash memory applying the output of a stage of FIFO memories of said FIFO memory means.

9. The real-time moving picture signal processing apparatus using flash memories according to claim 8, wherein each stage of said FIFO memory means comprises a plurality of FIFO memories connected in series.

10. The real-time moving picture signal processing apparatus using flash memories according to claim 9, wherein each stage of said FIFO memory means comprises a device for storing data corresponding to at least one of: a writing and reading capacity of one flash memory.

* * * * *